United States Patent
Yeh et al.

(10) Patent No.: US 7,708,585 B2
(45) Date of Patent: May 4, 2010

(54) SOCKET CONNECTOR ASSEMBLY HAVING LOCK-DOWN INDICATOR PREVENTING OVERSTRESSING

(75) Inventors: Cheng-Chi Yeh, Tu-cheng (TW); Nan-Hung Lin, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/386,637

(22) Filed: Apr. 21, 2009

(65) Prior Publication Data

US 2009/0264005 A1     Oct. 22, 2009

(30) Foreign Application Priority Data

Apr. 21, 2008     (TW) .............................. 97206767 U

(51) Int. Cl.
*H01R 4/24*     (2006.01)

(52) U.S. Cl. ..................... 439/489; 439/331

(58) Field of Classification Search ................ 439/73, 439/331, 342, 488, 489
See application file for complete search history.

(56) References Cited

U.S. PATENT DOCUMENTS

| | | | |
|---|---|---|---|
| 7,234,955 B1* | 6/2007 | Ho | 439/331 |
| 7,575,461 B2* | 8/2009 | Fan | 439/331 |
| 2006/0105608 A1* | 5/2006 | Ma | 439/331 |

* cited by examiner

*Primary Examiner*—Khiem Nguyen
(74) *Attorney, Agent, or Firm*—Andrew C. Cheng; Wei Te Chung; Ming Chieh Chang

(57) ABSTRACT

An electrical connector mounted to a printed circuit board includes an insulation housing mounted to a printed circuit board, a plurality of contacts received in the insulation housing, a load plate covering the insulation housing. And an indicator disposed on the load plate. The indicator has a indicating portion, the showing abouting against the printed circuit board and capable of changing positions relative to the load plate, so that the operator may observe an assembly process of the load plate. The electrical connector has a simple configuration and reliable connection.

15 Claims, 5 Drawing Sheets

SOCKET CONNECTOR ASSEMBLY HAVING LOCK-DOWN INDICATOR PREVENTING OVERSTRESSING

BACKGROUND OF THE INVENTION

1. Field of the Invention

The present invention relates to a socket connector assembly, and more particularly to a socket connector assembly including a load plate incorporated with an indicator in which the downward movement of the load plate toward a printed circuit board can be readily controlled so as to prevent a screw from overstressing.

2. Description of the Prior Art

A conventional a electrical connector mounted to a printed circuit board for electrically contacting an IC package, comprises a bottom frame having a screw hole on a front edge thereof. A load plate able to open and close is pivotally assembled to the bottom frame by fasteners. The load plate has a through hole on a front edge thereof. The bolts is pre-assembled to the through hole on the front edge of the load plate by a gasket. When the load plate covers closes down, the fix bolt inserts into the screw hole of the bottom frame to make the load plate press the IC package and retain the IC package to the electrical connector. Though the load plate of the conventional electrical connector provides a pressing function push down, a locking situation of the load plate can not be observed during a locking process, user can not control, a force acted by the load plate on the IC package. when the bolt is locked down, there is no indicator showing when the load plate reaches its substantial final position. In case the bolt is overturned, it may damage the printed circuit board. However, it the bolt is not locked down enough, the electrical connections between the package and the socket could be negatively effected.

In view of the above, a new electrical connector that overcomes the above-mentioned disadvantages is desired.

SUMMARY OF THE INVENTION

Accordingly, an object of the present invention is to provide an electrical connector to show the load plate with lock process.

To fulfill the above-mentioned object, an electrical connector mounted to a printed circuit board, comprises: an insulative housing mounted to a printed circuit board; a plurality of contacts received in the insulative housing; a load plate covering the insulative housing and having a tongue portion; and an indicator disposed on the load plate and having a indicating portion located below the tongue portion, the indicating portion pressed upwardly during a downwardly movement of the load plate relative to the printed circuit board to have a displacement relative to the load plate.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
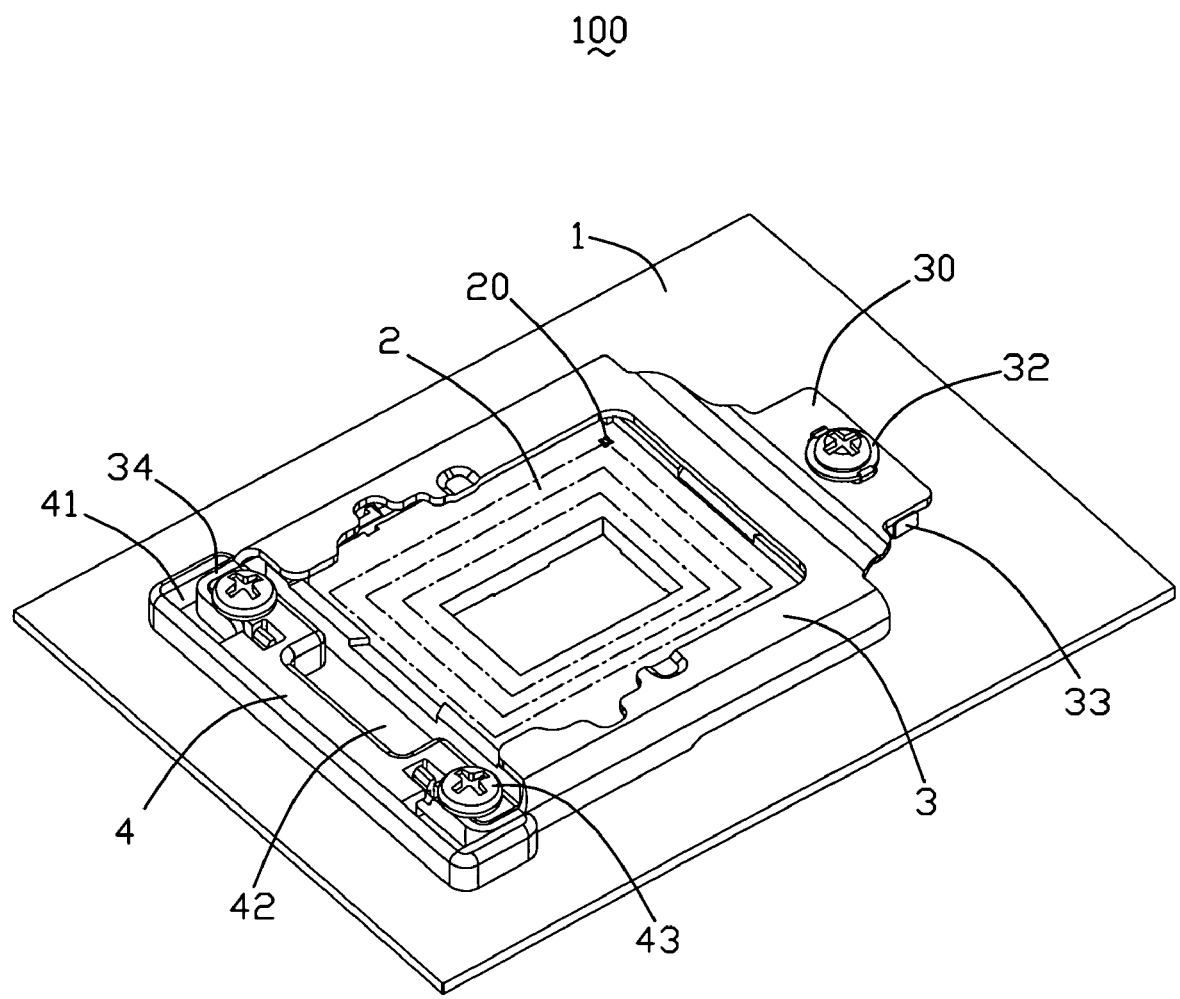
FIG. 1 is an assembly, perspective view of an electrical connector in accordance with present invention, wherein the electrical connector is in a closed position.
Figure 2:
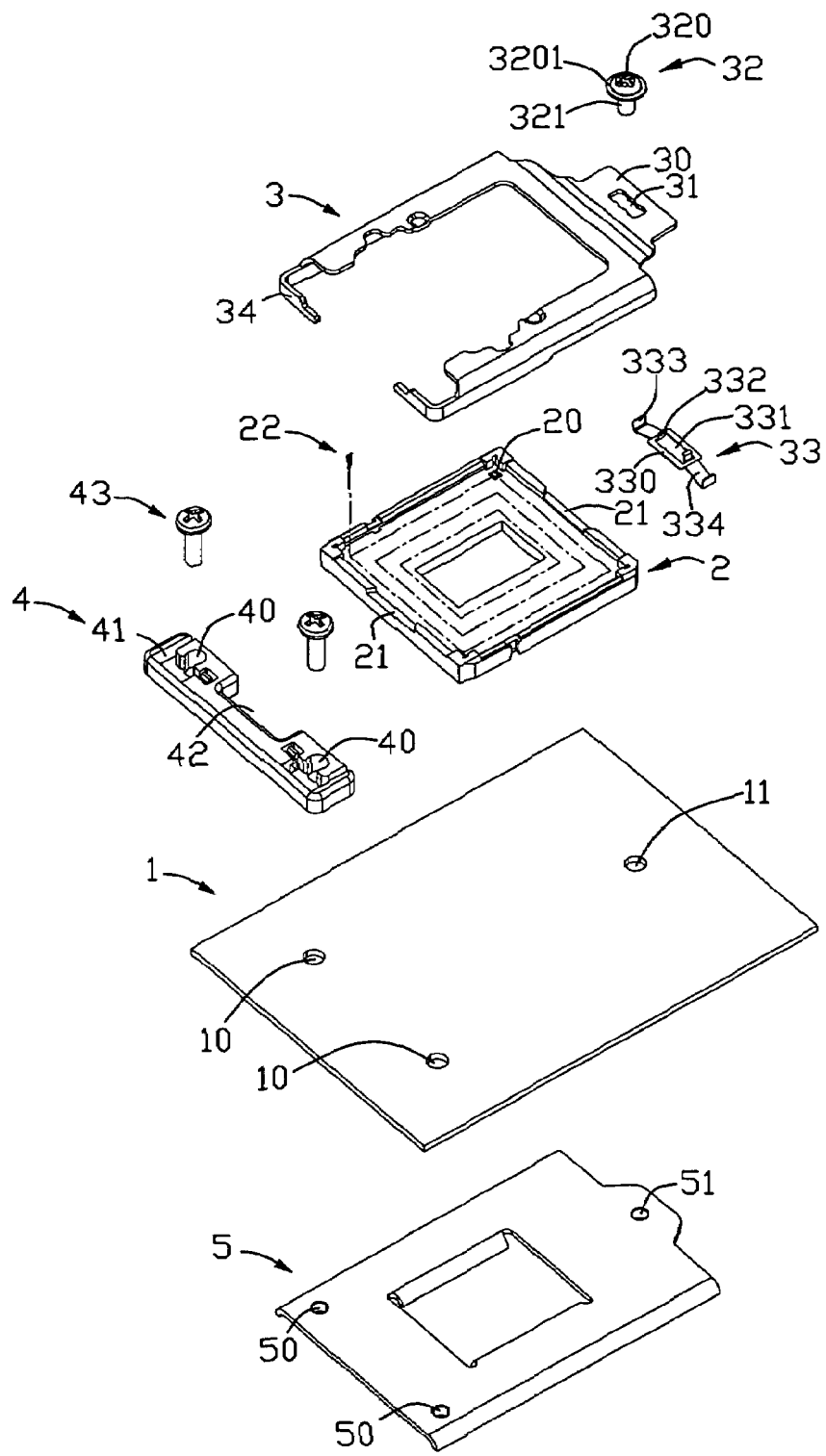
FIG. 2 is an exploded, perspective view of the electrical connector of FIG. 1.
Figure 3:
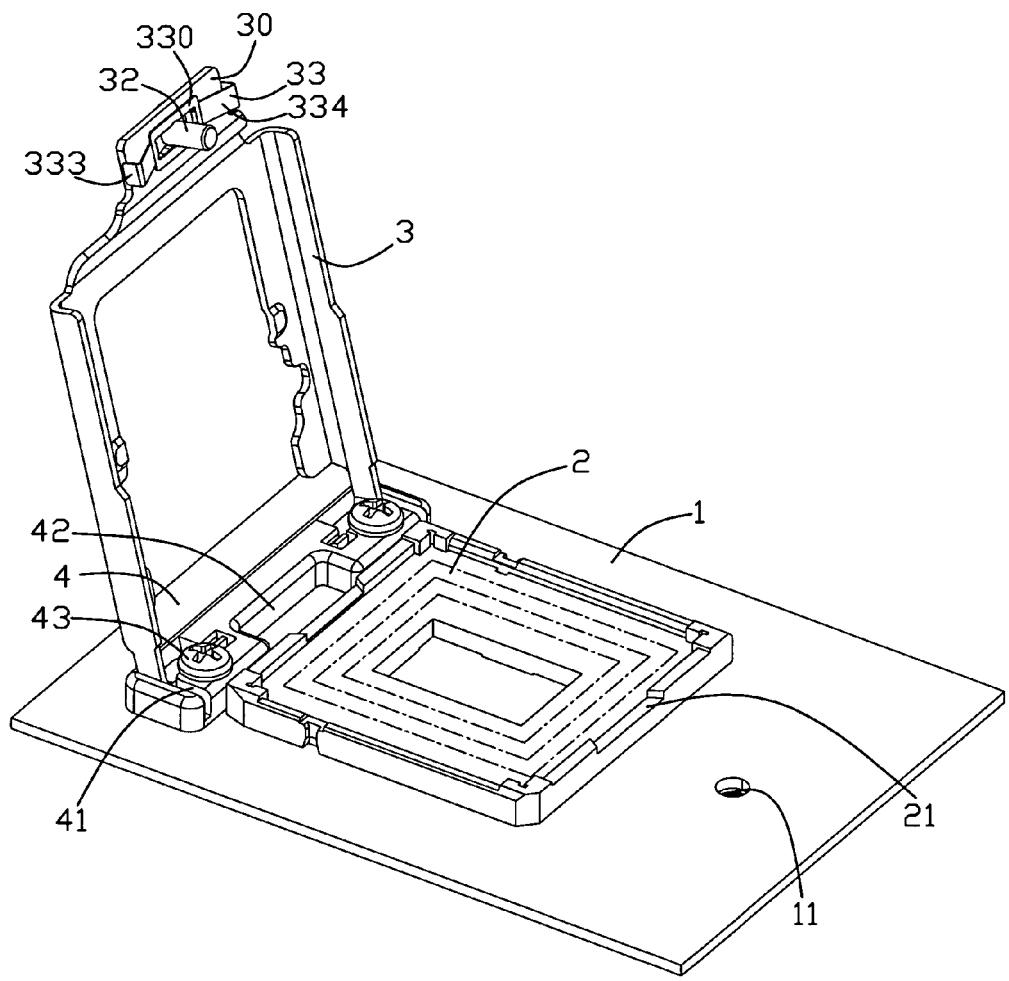
FIG. 3 is another assembly, perspective view of the electrical connector, wherein the electrical connector is in an open position.
Figure 4:
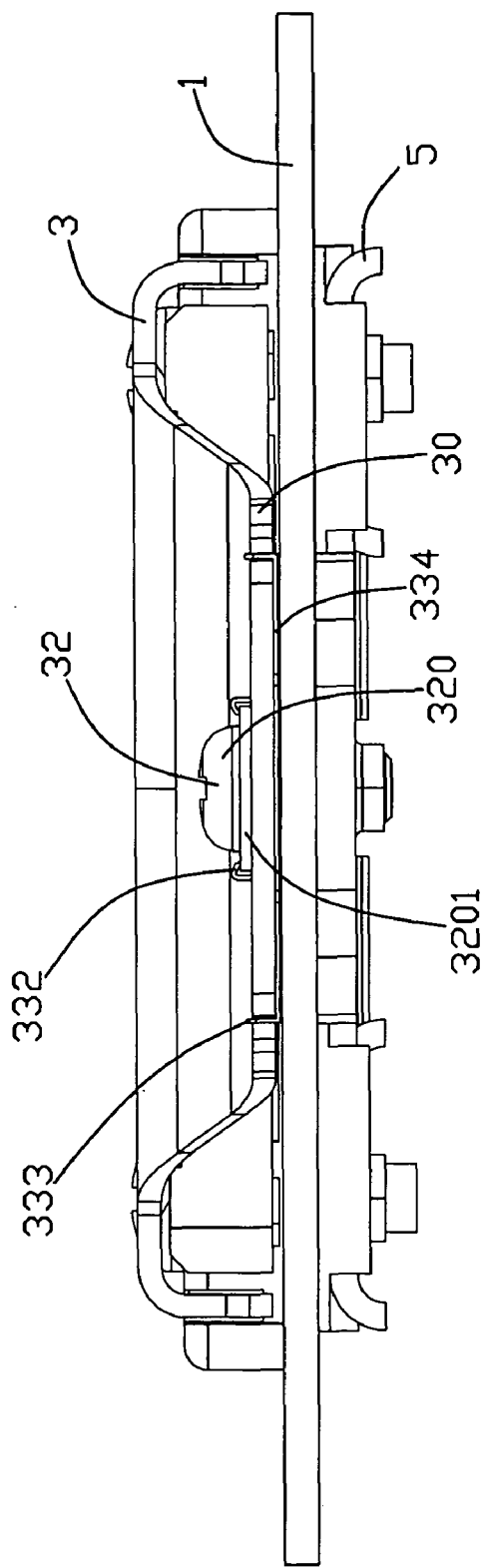
FIG. 4 is a front view of the electrical connector mounted to a printed circuit board.
Figure 5:
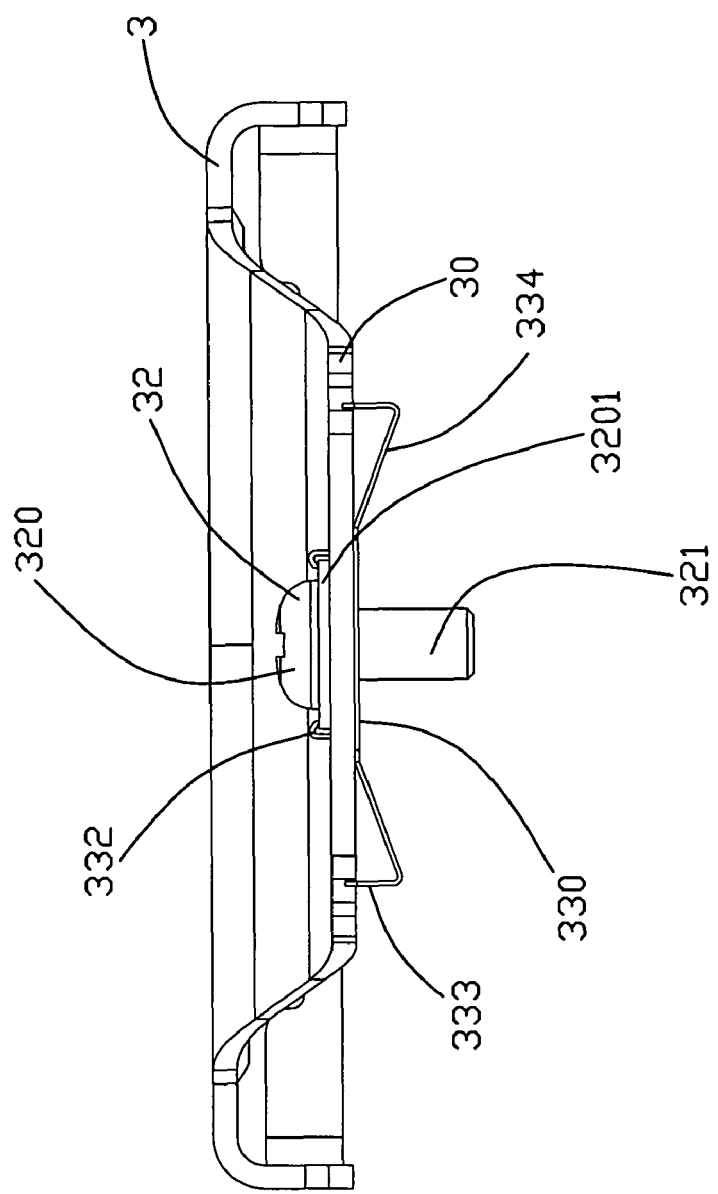
FIG. 5 is a front view of the electrical connector assembly, showing an indicator and a bolt assembled to a load plate.

Referring to FIGS. 1-3, an electrical connector 100 mounted to a printed circuit board 1, comprises an insulative housing 2, a load plate 3 load plateing the insulative housing 2, a linked device 4 mounted to the printed circuit board 1 for linking the load plate 3, a backboard 5 located on a bottom side of the printed circuit board 1.

The printed circuit board 1 has a pair of first through holes 10 at a first end thereof and a second through hole 11 at a second end thereof. The backboard 5 is located at the bottom side of the printed circuit board 1 and has a pair of first screwing holes 50 corresponding to the first through holes 10 and a second screwing hole 51 corresponding to the second through hole 11 of the printed circuit board 1.

Referring to FIGS. 2-3, the insulative housing 2 is configured to a rectangle shape, and defines a plurality of contacting holes 20 for receiving a plurality of contacts 22. The insulative housing 2 has a pair of recesses 21 on central parts of two opposite sidewalls thereof. The linked device 4 is mounted to the printed circuit board 1. The linked device 4 is a substantially U-shaped configuration and includes two contacting holes 40 on two ends thereof and a recessed portion 42 between the two contacting holes 40. A right-angled slot 41 recessed from a top surface thereof and communicating with the contacting hole 40. The linked device 4 further includes two pin members, such as bolts 43, which are received in the corresponding contacting holes 40 and pass through the first though holes 10 of the printed circuit board 1 and finally are screwed into the first screwing holes 50 of the backboard 5. Thus, the linked device 4 is reinforced on the printed circuit board 1 by the backboard 5.

The load plate 3 is stamped from a metal piece and also in a U-shape. The load plate 3 has a tongue portion 30 extending forwardly and defining a hole 31 for receiving a fastener 32. Each lateral edge of the load plate 3 has an orthogonal pivotal portion 34 bent from a free end thereof and contained into the corresponding slot 41 of the linked device 4 to pivotally assemble the load plate 3 to the linked device 4 to cover the insulative housing 2. Moreover, top edges of the pivotal portions 34 are restrained by heads of the two bolts 43, respectively. Thus, when the load plate 3 is rotated, stresses produced by the pivotal portions 34 are shared by the two bolts 43.

Referring to FIGS. 2-5, the fastener 32 is attached to the tongue portion 30 of the load plate 3 by an indicator 33. The indicator 33 has a base 330, an engaging hole 331 defined on a middle part of the base 330, two clips 332 bent from two opposite inner sides of the engaging hole 331, respectively, two spring arms 334 extending obliquely and downwardly from two opposite outside edges of the base 330, respectively and two indicating portion 333 upwardly bent from free ends of the spring arms 334, respectively. The fastener 32 has a head portion 320 and a haulm portion 321 (screw thread not shown), wherein a project portion 3201 is located below the head portion 320 of the fastener 32 and projects outwardly.

The indicator 33 is inserted to the tongue portion 30 from a bottom side, the clip 332 passes though the hole 31 of the tongue portion 30 of the load plate 3 from a bottom side. The fastener 32 is retained to the tongue portion 32 from a top side, the haulm portion 321 passes though the hole 31 and the engaging hole 331 of the indicator 33, the project portion 3201 is locked by the clip 332 of the indicator 33, the indicator 33 and the fastener 32 engage with each other and are locked to the tongue portion 30. The base 330 of the indicator 33 is disposed below the tongue portion 30 of the load plate 3. The indicating portion 333 of the indicator 33 is located on two sides the tongue portion 30 of the load plate 3. The head portion 320 of the clip 32 is disposed upon the tongue portion 30 of the load plate 3.

When the load plate 3 is pushed down toward the printed circuit board 1 to cover the insulative housing 2, when the sprig arm 334 touches the printed circuit board 1, will abut against the printed circuit board 1 and bring the spring ram 334 to deform, while the load plate 3 still can move downwardly, that means the load plate 3 moves downwardly relative to a bottom end of the spring arm 334 linked with the indicating portion 333, the spring arm 334 together with the indicator 33. So the indicator 33 can projected beyond a top surface of the tongue portion 30 of the load plate 3, according to a projecting length of the indicating portion 333, operator can know a situation of the fastener 32 inserting into the printed circuit board 1. Furthermore the indicating portion 333 may be drawn with a signal line, when the sign line is shown to be aligned with the top surface of the tongue portion 30, that means the load plate 3 is arrived right position.

The clip 332 of the indicator 33 of the electrical connector 100 locks the project portion 3201 of the head portion 320 of the fastener 32, the indicating portion 333 of the indicator 33 are located on two outsides of the tongue portion 30 of the load plate 3, when the load plate 3 is completely locked to the printed circuit board 1. The signal line of the indicating portion 333 of the indicator 33 can tell operator whether the load plate 3 arrives the right position.

The present invention has another preferred embodiment, the indicator may be mounted to the printed circuit board, the clip of the indicator latches with inside edge of the first though hole of the printed circuit board, the bolt assembled on the tongue portion inserts in the first though hole of the printed circuit board from a top to down direction. The base of the indicator is located below the tongue portion of the load plate. The indicating portion of the indicator is located on two outsides of the tongue portion of the load plate.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector mounted to a printed circuit board, comprises: an insulative housing mounted to a printed circuit board; a plurality of contacts received in the insulative housing; a load plate covering the insulative housing and having a tongue portion; and an indicator disposed on the load plate and having a indicating portion located below the tongue portion, the indicating portion extending upwardly during a downwardly movement of the load plate relative to the printed circuit board to have a displacement relative to the load plate; wherein the indicator has a base an engaging hole defined on the base, two clips bent upwardly from two opposite inner sides of the engaging hole, two spring arms extend downwardly from the base and a indicating portion bent upwardly from the spring arms.

2. The electrical connector as claimed in claim 1, further comprising a fastener, the fastener has a head portion and a haulm portion, a project portion is located below the head portion of the fastener and projects outwardly.

3. The electrical connector as claimed in claim 2, wherein the tongue portion of the load plate has a hole, the clips of the indicator passes though the hole of the tongue portion of the load plate from a bottom side, the fastener is retained to a engaging hole of the indicating portion of the indicator from a top side, and the project portion is locked by the clip.

4. The electrical connector as claimed in claim 3, wherein the base of the indicator is disposed below the tongue portion of the load plate.

5. The electrical connector as claimed in claim 4, wherein the indicating portions of the indicator is located on two sides the tongue portion of the load plate.

6. The electrical connector as claimed in claim 5, wherein the head portion of the fastener is disposed upon the tongue portion of the load plate, the haulm portion of the fastener passes though the engaging hole of the indicator.

7. The electrical connector as claimed in claim 1, further comprising a linked device, the linked device is a substantially U-shaped configure and includes two contacting holes on two ends thereof and a recessed portion between the two contacting holes.

8. The electrical connector as claimed in claim 7, further comprising a slot, wherein the load plate has two orthogonal pivotal portions bent from two free ends of central sides thereof and contained into the corresponding slot defined on the linked device to pivotally assemble the load plate to the linked device to load plate the insulative housing.

9. An electrical connector assembly comprising: a printed circuit board defining opposite upper and bottom surfaces thereof; a housing positioned upon the upper surface; and a load plate moveably covering the housing and fastened to the printed circuit board at an end thereof; wherein an indicator is moveable relative to the load plate in a floating manner under condition that said indicator is pushed upward to be in an upper position when said load plate is downwardly locked to the printed circuit board and intimately covering said housing; wherein said indicator includes a main body sandwiched between the load plate and the printed circuit board when said load plate is locked to the printed circuit board.

10. The electrical connector assembly as claimed in claim 9, wherein said indicator is located around said end.

11. The electrical connector assembly as claimed in claim 9, wherein said indicator is deflectable.

12. The electrical connector assembly as claimed in claim 9, wherein said load plate defines a tongue at said end, and said indicator grasps said tongue when said load plate is locked to the printed circuit board.

13. The electrical connector assembly as claimed in claim 9, further including a linking device to lock the other end of the load plate to the printed circuit board.

14. The electrical connector assembly as claimed in claim 9, wherein said indicator is associated with the load plate via a screw.

15. An electrical connector assembly comprising: a printed circuit board defining an upper face; an insulative housing positioned upon the upper face; an indicator positioned upon the printed circuit board; a load plate fastened to the printed circuit board to expose the indicator beyond the load plate, and cooperating with the printed circuit board to sandwich said indicator therebetween; wherein said indicator is lifted by downward movement of the load plate.

* * * * *